(12) United States Patent
Rugg et al.

(10) Patent No.: US 7,542,231 B2
(45) Date of Patent: Jun. 2, 2009

(54) DISC DRIVE APPARATUS HAVING DRIVE ELECTRONICS TOP MOUNTED ON FLEXIBLE PRINTED CIRCUIT BOARD

(75) Inventors: William Leon Rugg, Longmont, CO (US); Todd Warren Kube, Boulder, CO (US)

(73) Assignee: Seagate Technology, Scotts Valley, CA (US)

( * ) Notice: Subject to any disclaimer, the term of this patent is extended or adjusted under 35 U.S.C. 154(b) by 1128 days.

(21) Appl. No.: 10/602,791

(22) Filed: Jun. 24, 2003

(65) Prior Publication Data
US 2004/0037007 A1 Feb. 26, 2004

Related U.S. Application Data

(60) Provisional application No. 60/404,682, filed on Aug. 20, 2002.

(51) Int. Cl.
*G11B 33/14* (2006.01)
(52) U.S. Cl. .................. 360/97.02; 360/245.9; 720/650
(58) Field of Classification Search ............... 360/97.01, 360/97.02, 245.9; 369/75.11, 76; 720/652, 720/648, 650
See application file for complete search history.

(56) References Cited

U.S. PATENT DOCUMENTS

| | | |
|---|---|---|
| 5,495,377 A | 2/1996 | Kim |
| 5,631,788 A | 5/1997 | Richards |
| 5,717,541 A | 2/1998 | Ycas et al. |
| 5,859,746 A | 1/1999 | Ishida et al. |
| 5,909,338 A | 6/1999 | Butler et al. |
| 5,940,252 A | 8/1999 | Patterson |
| 5,995,321 A | 11/1999 | Ishida |
| 6,018,439 A | 1/2000 | Forbord et al. |
| 6,108,162 A | 8/2000 | Amirkiai et al. |
| 6,163,443 A | 12/2000 | Hatagami et al. |
| 6,166,888 A | 12/2000 | Tsuda et al. |
| 6,243,262 B1 * | 6/2001 | Koo et al. .................. 361/687 |
| 6,315,584 B1 * | 11/2001 | Greenside et al. ........... 439/135 |
| 6,388,834 B1 * | 5/2002 | Bernett et al. ............ 360/97.01 |
| 6,480,362 B1 | 11/2002 | Yoshida et al. |
| 6,678,112 B1 * | 1/2004 | Kaneko ................... 360/97.01 |
| 6,797,882 B1 * | 9/2004 | Crane et al. ................. 174/52.4 |
| 2003/0016468 A1 | 1/2003 | Hayakawa et al. |

FOREIGN PATENT DOCUMENTS

EP 0760510 A1 3/1997

* cited by examiner

*Primary Examiner*—Julie Anne Watko
(74) *Attorney, Agent, or Firm*—David K. Lucente

(57) ABSTRACT

A disc drive has actuator servo-controls and signal processing electronics positioned on, and electrically connected to, a flex printed circuit board positioned on a top surface of a base along with the actuator assembly and the spindle motor of the disc drive. A power combo chip is also positioned on the flex printed circuit board that is positioned on the top surface of the base. A top cover is attached to the base to form an enclosed space. The actuator assembly and the spindle motor are within the enclosed space and the actuator servo-controls and signal processing electronics are outside the enclosed space.

11 Claims, 6 Drawing Sheets

DISC DRIVE APPARATUS HAVING DRIVE ELECTRONICS TOP MOUNTED ON FLEXIBLE PRINTED CIRCUIT BOARD

RELATED APPLICATIONS

This application claims priority of U.S. provisional application Ser. No. 60/404,682, filed Aug. 20, 2002.

FIELD OF THE INVENTION

This application relates generally to data storage devices and more particularly to the placement of electronic control circuit components in a data storage device.

BACKGROUND OF THE INVENTION

Disc drives are data storage devices that store digital data in optical, opto-magnetic, and/or magnetic form on a rotating storage medium on a disc. The typical disc drive includes a base plate on which various structural components are mounted. The various structural components include, for example, a disc, an actuator assembly, and a spindle motor rotating the disc. Modern magnetic disc drives comprise one or more rigid discs that are coated with a magnetic medium and mounted on a hub of the spindle motor for rotation at a constant high speed. Information is stored on the discs in a plurality of concentric circular tracks typically via an array of transducers mounted to a rotary actuator for movement of the heads relative to the discs. The discs drive motor assembly, collectively known as a head/disc assembly (HDA), a devise having all control electronic circuits integrated above the base plate, and the actuator are typically enclosed on the base plate by a cover forming a sealed environment to prevent contamination within the system that could result in disc failure.

The typical disc drive also includes a printed circuit board assembly that provides the majority of the electronic circuits necessary for control of operation of the disc drive, including controlling positioning of the actuator and transducers. This printed circuit board assembly is mounted outside the sealed head disc assembly traditionally, beneath the disc drive plate on an underside surface of the base. Input and output signals are fed to and from the disc drive via the printed circuit board circuitry and the HDA. These signals are typically supplied to the HDA via a pass-through connector that extends through and seals an opening into the enclosed head disc assembly and then through a flexible printed circuit cable to the actuator assembly. The printed circuit cable has one end physically terminating on the actuator assembly and the other end connected to the pass-through connector. These terminations inherently exhibit losses.

One problem that has arisen with this design is that it necessitates several connections between the components on the printed circuit board and the flex-circuit cable, which increases the losses in the electrical circuitry system. Accordingly there is a need for a disc drive system that reduces or eliminates these problems. The present invention provides a solution to this and other problems, and offers other advantages over the prior art.

In addition, the printed circuit board, the pass-through connector and flex-circuit cable are traditionally attached to the base plate and then physically electrically connected to each other in separate steps. Because the manufacturing process currently requires these separate steps, it is also desirable to provide a system that eliminates some of these steps.

SUMMARY OF THE INVENTION

Against this backdrop embodiments of the present invention have been developed. One embodiment of the invention features a disc drive having all of its actuator servo-controls and signal processing electronics circuitry incorporated onto a flexible printed circuit assembly positioned on a top surface of the base plate adjacent the external power and interface connector of the disc and alongside the head disc assembly (HDA), which includes the actuator assembly and the discs mounted on the spindle motor enclosed between the base plate and cover. In this embodiment, the top cover together with the base plate encloses only the HDA. The cover avoids the power, actuator servo-controls and signal processing electronics components mounted on the flexible printed circuit board adjacent the HDA so that these components may be cooled by ambient air circulation.

In another aspect of the invention, the flexible printed circuit board is attached to a stiffener plate against a bottom surface of the flex printed circuit board. This stiffener plate functions in a multiplexing fashion as an electrical ground plane and a power plane for the components mounted on the flex printed circuit assembly. The printed circuit assembly and power and ground plane stiffeners are electrically connected to the components by a network of metal stakes. The flexible printed circuit board and stiffener plate assembly is inserted into and connected to the external power and interface connector that is, in turn, fastened to the base plate of the disc drive.

The flexible circuit board assembly of the invention includes a pigtail lead trace that extends beneath the discs in the HDA to provide power to the spindle motor. The flexible circuit board also includes a lead trace that connects to the actuator assembly within the HDA.

In an alternative embodiment the flexible circuit board assembly includes an actuator lead pad to which a separate lead trace, fastened to the actuator assembly during HDA assembly, is connected.

These and various other features as well as advantages which characterize the present invention will be apparent from a reading of the following detailed description and a review of the associated drawings.

DETAILED DESCRIPTION

Figure 1:
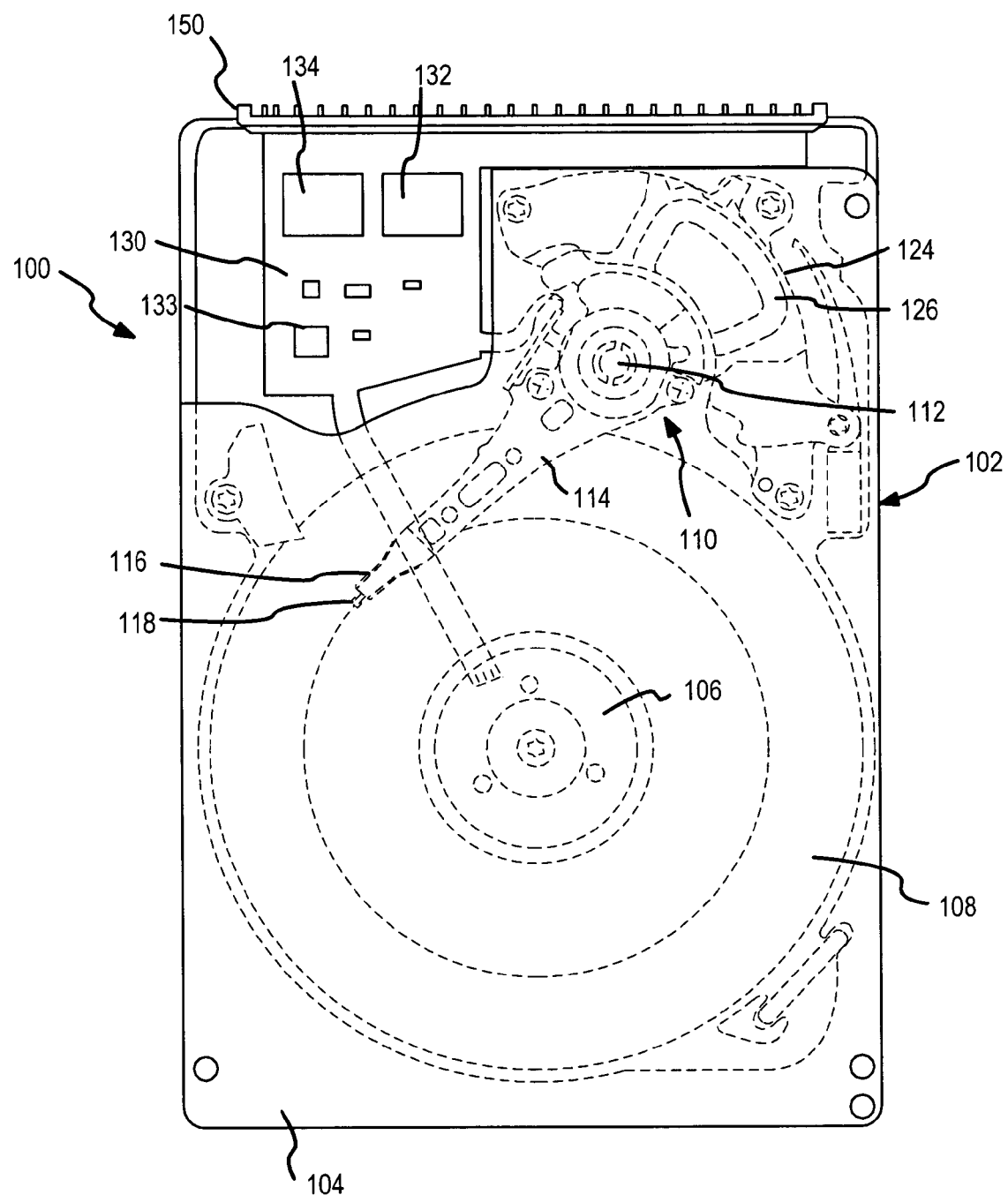
FIG. 1 is a plan view of a disc drive incorporating one embodiment of the present invention showing the primary internal components of the disc drive beneath the cover in dashed lines.

A disc drive 100 constructed in accordance with an embodiment of the present invention is shown in FIG. 1. Throughout this specification like numerals will be used to identify like elements in the various embodiments shown and described for consistency and ease of identification. The disc drive 100 includes a base plate 102 to which various components of the disc drive 100 are mounted. This base plate is essentially a generally rectangular plate that has a peripheral wall to which a top cover 104 is attached. The top cover 104 cooperates with the base plate 102 to form an internal, closed head disc assembly (HDA) environment for several of the various components of the disc drive. These components are shown in dashed lines in FIG. 1. The components include a spindle motor 106 that rotates one or more data storage discs 108 at a constant high speed. Each of these data storage discs supports on its surface a storage media such as optical media or a layer of magnet media. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118 that includes a fluid bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets (not shown) which establish a magnetic field in which the coil 126 is immersed. The controlled application of current to the coil 126 causes magnetic interaction between the permanent magnets and the coil 126 so that the coil 126 moves in accordance with the well known Lorentz relationship. As the coil 126 moves, the actuator assembly 110 pivots about the bearing shaft assembly 112, and the heads 118 are caused to move across the surfaces of the discs 108.

A flex printed circuit board assembly 130, in accordance with an embodiment of the invention, provides the requisite electrical connection paths to and from the actuator assembly 110 while allowing pivotal movement of the actuator assembly 110 during operation, supports power and control electronics components for the spindle motor 106 and control of the actuator assembly 110, lead traces to a preamplifier mounted on the actuator assembly 110 and lead traces connected to the motor 106. The head wires (not shown) are routed from the preamplifier 165 along the actuator arms 114 and the flexures 116 to the heads 118.

Figure 2:
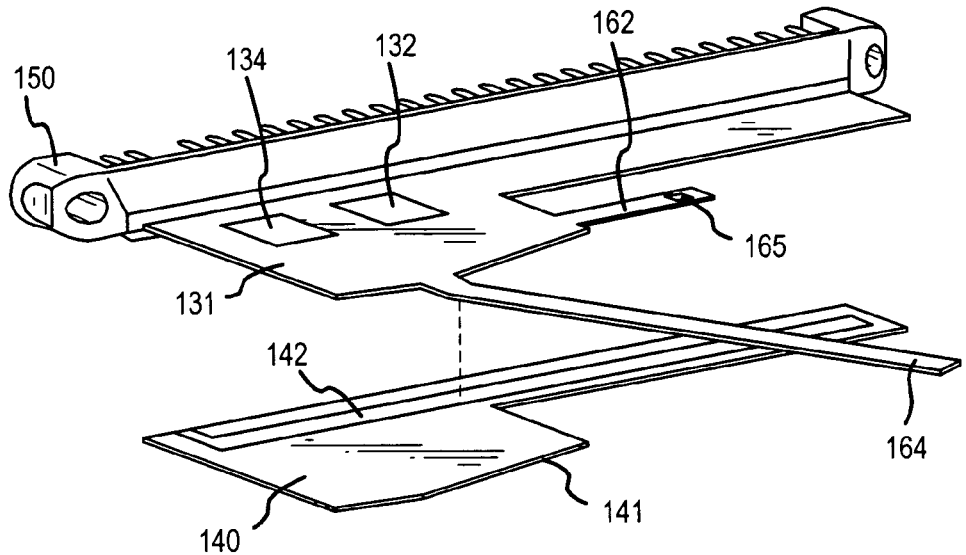
FIG. 2 is a separate exploded perspective view of a flexible printed circuit assembly of the embodiment shown in FIG. 1.
Figure 3:
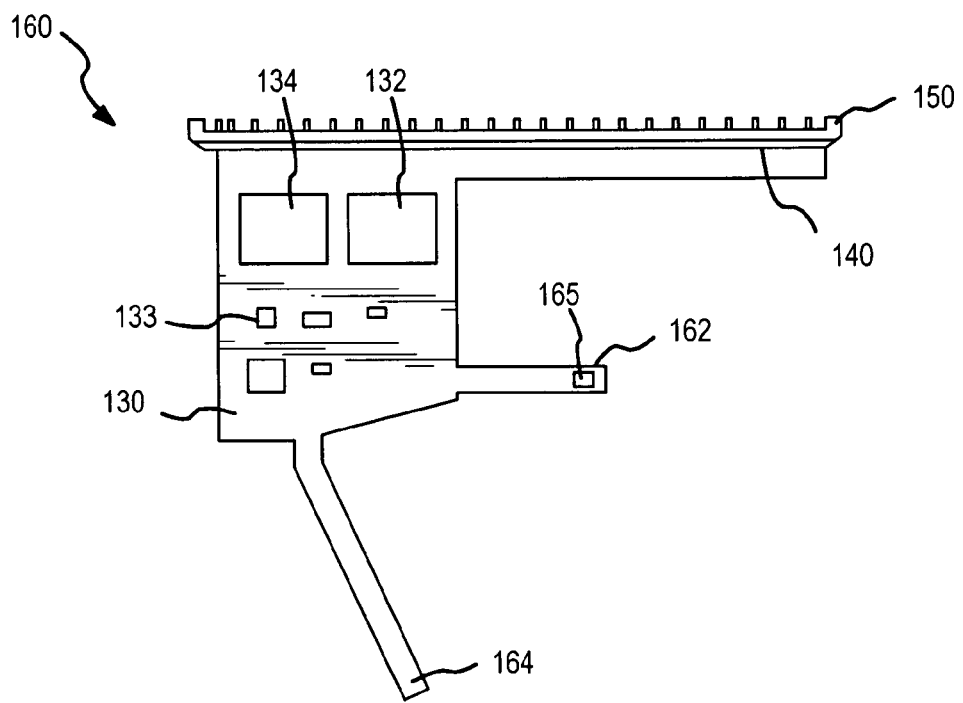
FIG. 3 is a separate plan view of the flexible printed circuit assembly shown in FIG. 2.
Figure 4:
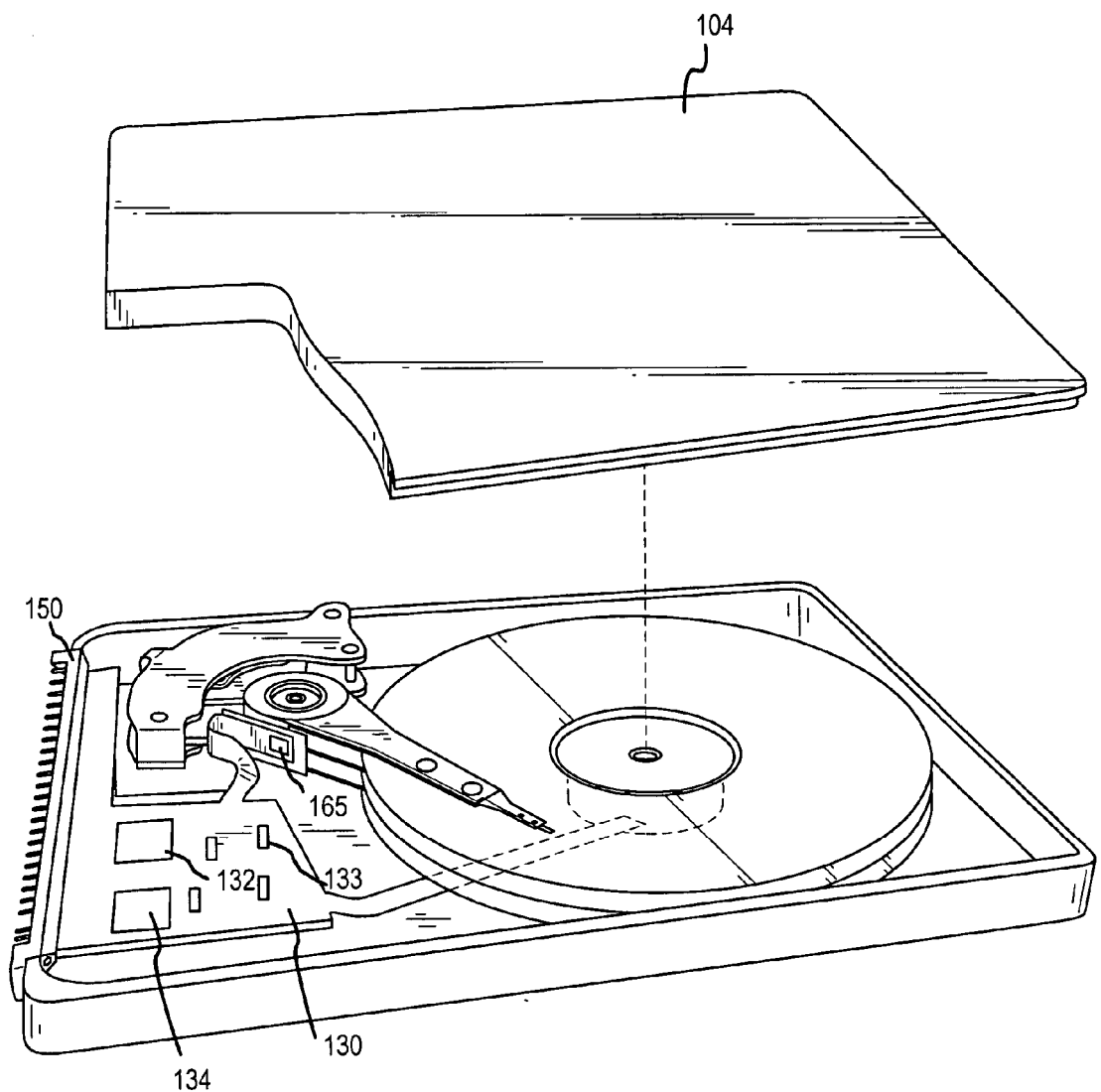
FIG. 4 is a perspective view of the disc drive in FIG. 1 with the cover spaced from the head disc assembly.

The flex printed circuit board assembly 130 in the embodiment shown in FIG. 1 is separately shown in FIGS. 2 and 3 and a perspective view of the installation of the flex assembly 130 is shown in FIG. 4. The flex assembly 130 preferably includes circuitry for controlling the write currents applied to the heads 118 during a write operation and a preamplifier 165 for amplifying read signals generated by the heads 118 during a read operation. As is shown in FIG. 2, the flex assembly 130 has a flexible printed circuit 131 and a stiffener plate 140 fastened to the flexible printed circuit 131. The stiffener plate 140 and circuit 131 are in turn inserted into a slot in the rear of the connector 150 to electrically connect the traces on the circuit 131 to the connector pins of the connector 150. The connection between these pins and the traces (not shown) may be compression fit, soldered in place in a conventional manner, or otherwise electrically and physically connected to complete the flex assembly 130.

The flex assembly 130 preferably includes a multi-chip packaged (MCP) component 132 (also called a multi-chip module), passive components 133 such as discrete resistors, capacitors and diodes, and a power combo chip 134 soldered, or otherwise physically fastened, directly onto the flexible circuit 131 of the flex assembly 130. MCP's are modules that have multiple integrated circuits packaged on an insulating substrate. The integrated circuits are interconnected on the MCP component 132 and the MCP component 132 has external connections. The flex assembly 130 in its entirety takes the place of a rigid printed circuit board that is traditionally attached beneath the base plate of the drive. All of the typical modules found in a disc drive control system, such as an interface module, microprocessor, memory, read/write channel, and disc controller are incorporated into these components 132 and 134.

The power combo chip 134 preferably includes the output circuitry necessary to control and drive the VCM 124 and the spindle motor 106. The external connections of the MCP component 132 and the power combo chip 134 are preferably soldered directly onto the flexible circuit 131 of the flex assembly 130.

The standard external interface connector 150 is fastened to one end of the base plate 102 for connection of the drive 100 to external components (not shown). The stiffener plate 140 is preferably made of aluminum, as is typically the base plate 102. The flexible circuit 131 of the flex assembly 130 is preferably bonded to the aluminum stiffener 140, for example, using an adhesive. In addition to providing stiffness for connecting and disconnecting the connector 150 from the assembly, the stiffener 140 provides a ground plane 141 for the electronics on the flex assembly 130. In addition, the stiffener 140 incorporates an insulated power plane 142 connecting power to components 132 and chips 134. Power plane 142 preferably rests on a layer of insulating material, such as Mylar, to insulate the power plane 142 from the ground plane 141 of the aluminum stiffener 140. The power plane 142 may alternatively simply be routed out of the stiffener 140 to separate it from the ground plane 141. Power plane 142 and ground plane 141 would then simply be insulated from each other by a horizontal gap between them formed by the routing operation. The ground plane 141 and power plane 142 would then be adhesively bonded to the flexible circuit 131 and the components 132, 133 and 134 staked to the power plane and ground plane 142 and 140 via pins on the components and pads on the flexible printed circuit 131.

FIG. 3 is a plan view of the flex printed circuit assembly 130 connected to the connector 150. The flexible circuit 131 has a generally rectangular portion and an elongated connector portion along one edge inserted within the connector 150, coextensive with the stiffener plate 140. The flexible circuit 131 has pigtail leads 162 and 164 extending from edges of the rectangular portion spaced from the connector portion. These pigtail leads 162 extend beneath the cover 104 of the disc drive 100 as shown in FIG. 1. Pigtail lead 162 preferably carries, at its free end, a preamplifier 165. This preamplifier 165 is mounted on the side of the actuator assembly 110, as close as possible to the heads 118 on the actuator assembly 110 and is used to amplify the small read signals from the heads 118. An alternate location for the preamplifier 165, not shown, may be on the flex circuit adjacent the components 132 and 134, although, with the small signal strengths of signals from magnetoresistive read elements on the heads 118, a remote mounting of the preamplifier 165 is preferred. Pigtail lead 162 forms a curved flexible service loop type connection between the electronics on the flexible circuit 131 and the actuator assembly 110 so as to minimize any torque on the actuator arms in a conventional manner. Pigtail lead 164 extends from the edge of the rectangular portion of the flexible circuit 131 and lies essentially flat and extends straight under the discs 108 to the spindle motor 106. Pads on the lead 162 contact a connector on the bottom of the motor 106 to provide the requisite electrical connections to the motor 106.

The flex assembly 130 is preferably fastened to the base plate 102. The attachment to the base plate 102 can be achieved by a variety of methods. For example, the flex assembly 130 can be screwed or staked onto the base plate 102 or it could be attached using a pressure-sensitive adhesive. The flex assembly 130 is preferably installed on the base plate 102 prior to placement of the HDA components on the base plate 102. Assembly of the flex assembly 130 and connector 150 to the base plate 102 does not need to take place in a controlled clean room. Once the flex assembly 130 is attached to the base plate 102, the unit can then be placed in a clean environment, and the actuator assembly 110, discs 108 and spindle motor 106 installed. Then the lead 162 of the flex assembly 130 can be attached to the actuator assembly 110, and the head wires connected to the preamplifier 165 the respectively.

Alternatively, the leads 162, 164 of the flex assembly 130 could be soldered to the actuator assembly 110 and spindle motor 106 prior to attachment of the flex assembly 130 to the base plate 102. The manner in which the leads 162, 164 connect to the actuator assembly 110 and spindle motor 106 is generally known and further description is not necessary. Pigtail lead 162 can be formed into a service loop and alternatively attached to an aluminum L-bracket either separately fastened to the base plate 102 or integrated into the stiffener 140.

Once the leads 162, 164 are connected to the actuator assembly 110 and spindle motor 106, the top cover 104 is installed onto the base plate 102. This attachment is generally achieved by screwing the top cover 104 onto the base plate 102. A flexible seal is placed around the perimeter of the top cover 104 between the cover 104 and the base plate 102 in order to ensure that the environment between the top cover 104 and the base plate 102 remains clean and uncontaminated. This seal is preferably located under the peripheral edge of the cover 104 so that the cover 104 is pressed uniformly against the base 102, against and over the leads 162, 164 to maintain the HDA free of contaminants when the cover 104 is securely fastened to the base plate 102 via screws or other fasteners.

As shown in FIGS. 1 and 4, the top cover 104 is shaped so that it covers all the major moving components of the disc drive, such as the actuator assembly, disc, and spindle motor, and yet clears the rectangular portion of the flex assembly 130 supporting the electronic control and power components 132 and 132. Preferably, the top cover 104 only covers the leads 162 and 164 of the flex assembly 130. Although not shown in the exemplary embodiments illustrated, the cover 104 may extend to and cover portions of the connector 150.

The top cover 104 is preferably shaped in this manner for several reasons. Because the flex assembly 130 is located outside the top cover 104, the flex assembly 130 does not have to be manufactured and/or assembled in a clean room environment. Therefore, manufacturing costs can be decreased. Also, because the MCP 132 and power combo chip 134 are outside of the covered HDA, those electrical components remain available for further final testing after the top cover 104 is assembled onto the base plate 102. In addition, these components receive convection cooling from surrounding airflow.

By providing MCP component 132 and power combo chip 134 on top of the flex assembly 130, physical electrical connections are minimized and traditional connectors can be eliminated. For example, the disc drive 100 no longer requires a pass-through connector to conduct power and signals between the printed circuit board on the underside of the disc drive to elements of the disc drive that are mounted on the topside of the base plate. The overall footprint and form factor of the drive can be reduced. The bottom of the disc drive 100 may be flat, and eliminating any need for spacing from adjacent structures and may facilitate denser packaging of multiple disc drives together.

Figure 5:
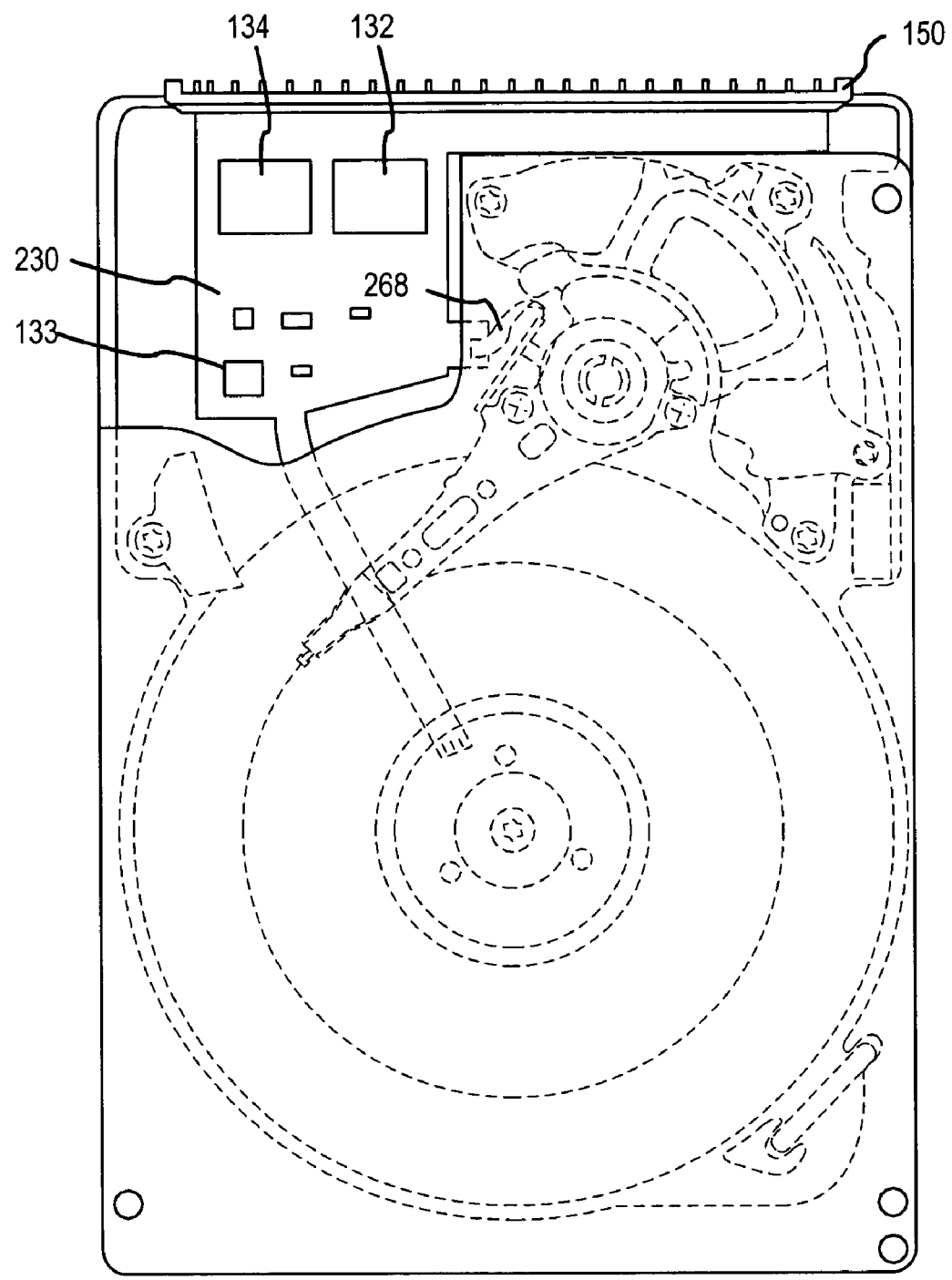
FIG. 5 is a plan view of a disc drive in accordance with an alternative embodiment of the present invention as in FIG. 1 with the top cover in place.
Figure 6:
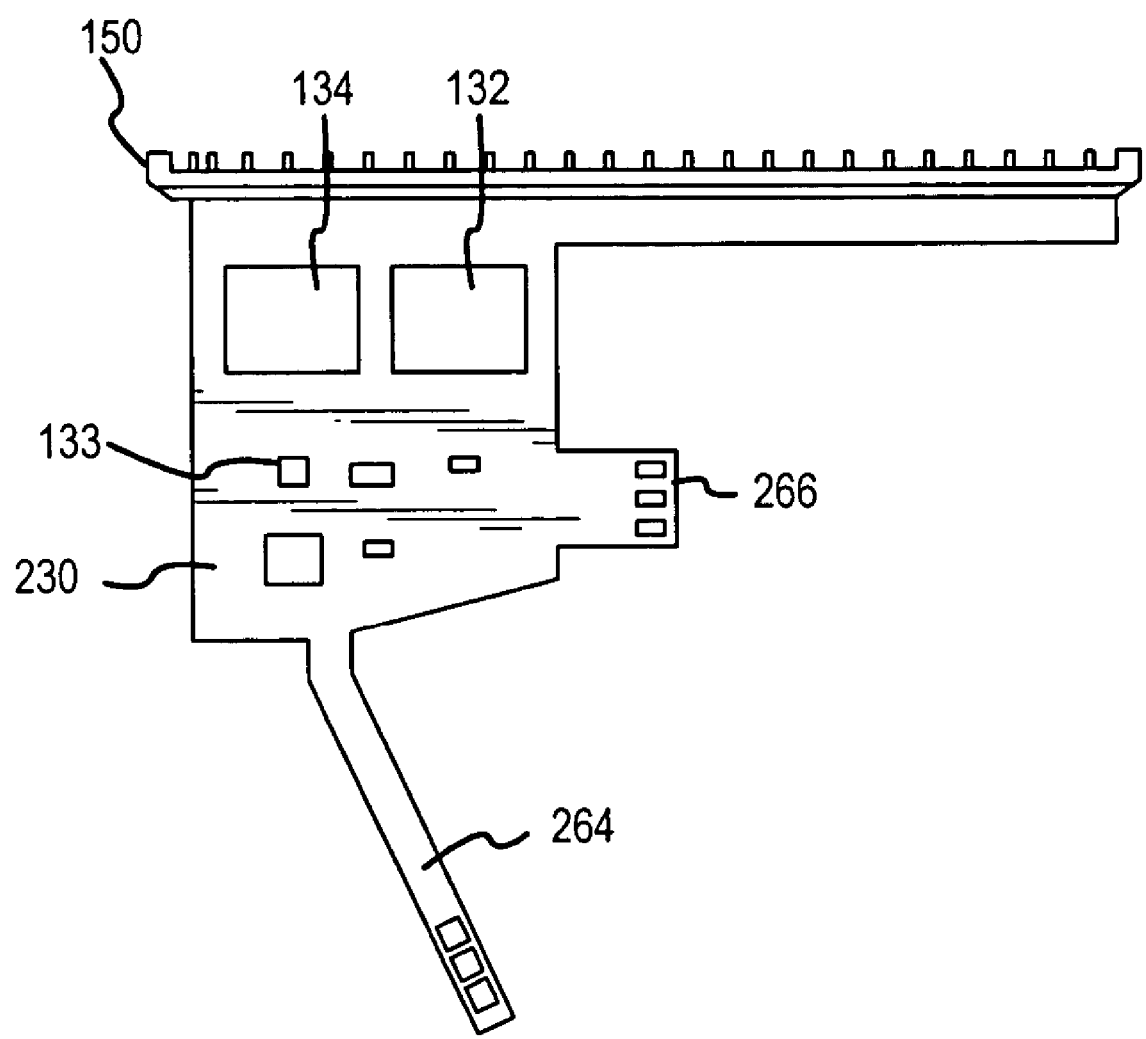
FIG. 6 is a separate plan view of the alternative flexible printed circuit assembly and connector in the embodiment shown in FIG. 5.
Figure 7:
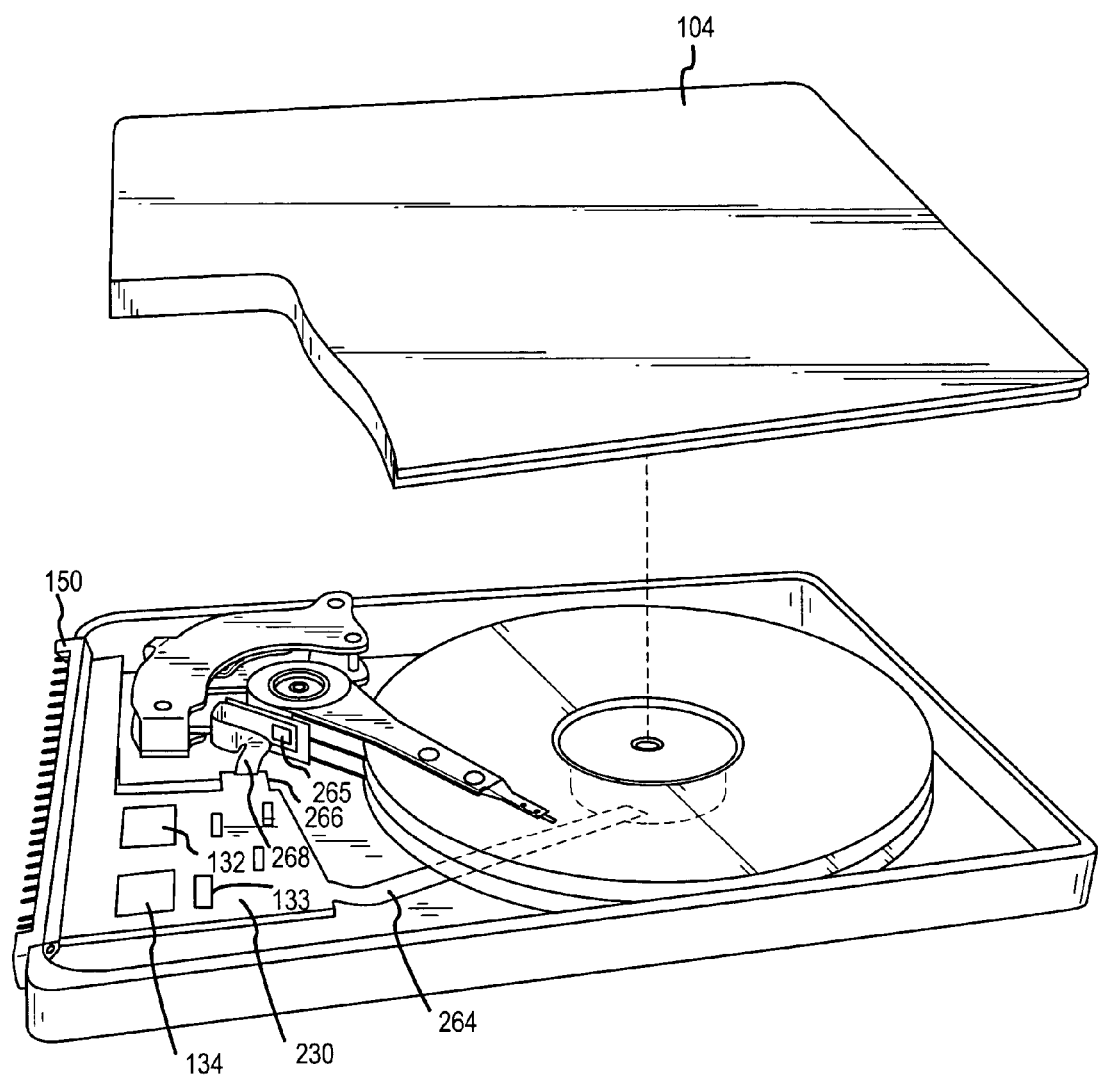
FIG. 7 is a perspective view of the disc drive in accordance with the alternative embodiment of the present invention shown in FIG. 5 with the top cover spaced from the head disc assembly.

An alternative embodiment of a flex assembly 230 is shown in FIGS. 5, 6, and 7. In this embodiment, the principal difference from assembly 130 is in the arrangement of the pigtail lead 266 that is electrically connected to the actuator assembly 110. In this alternative embodiment 230, the description set forth above regarding the structure of the stiffener 140, the ground plane 141 and power plane 142, the staking interconnection of the planes with the flexible circuit components 132, 133 and 134, and connector 150 is the same and therefore will not be repeated here. The pigtail lead 264 which leads to the spindle motor 106 also remains the same as in the first embodiment 130. The pigtail lead 266, for the actuator assembly 110, in this alternative, is different.

In this alternative embodiment, a separate pigtail lead 268, with a preamplifier 265 attached, is preferably separately assembled to the actuator assembly 110 prior to assembly of the head disc assembly onto the base plate 102. The flex assembly 230 in accordance with this embodiment, is manufactured with one lead 264 and one short pigtail lead 266 that includes a solder pad as is shown in FIG. 6. It may be desired to have the pigtail lead 268 connected to the actuator assembly 110 during the manufacturing process of the actuator assembly 110, perhaps at a separate vendor, to simplify the final assembly of the disc drive 100. In this embodiment as in the first embodiment, the flex assembly 230, with connector 150 attached, is fastened to the base plate 102. Then the base plate 102 may be placed in a clean environment and the HDA components installed. The lead 268 can then simply be soldered directly onto pad 266. Finally, the cover 104 is installed as has been previously described.

As another alternative, the short lead 266 may, in fact, be shortened so as to be outside the cover 104 when the cover 104 is installed. In this alternative, the pigtail 268 would extend beneath the installed cover 104 during the assembly process and the assembled drive removed from the clean environment for soldering of the pigtail lead 268 to the pads on the short lead 266. Again, in this embodiment, the preamplifier 265 may be located on the pigtail lead 268, or alternatively, if signal conditions permit in the design, preamplifier 265 could be located on the rectangular portion of the flexible circuit 230 adjacent the components 132 and 134.

It will be clear that embodiments of the present invention are well adapted to attain the ends and advantages mentioned as well as those inherent therein. While presently preferred embodiments have been described for purposes of this disclosure, various changes and modifications may be made which are well within the scope of the present invention. For example, the shape and orientation of the flex printed circuit assemblies 130 and 230 and top cover 104 can be changed without departing from the scope of the present invention. The cover 104 may cover portions or all of the flexible circuit assembly 130 in alternative designs. The stiffener 140, ground plane 142 and power plane 141 may be shaped differently than as described and shown. In addition, the flex circuit assembly of the present invention with a ground and power plane integrated into a stiffener plate may be utilized in other environments than in a disc drive as above described. Such a flexible circuit assembly as 130 could be utilized in a variety of hand held electronic devices and any electronics assembly that requires the use of a printed circuit board, in place of the printed circuit board. Numerous other changes may be made which will readily suggest themselves to those skilled in the art and which are encompassed in the spirit of the invention disclosed and as defined in the appended claims.

What is claimed is:

1. A data storage device comprising:
   a base plate having a top surface;
   a spindle motor positioned on the top surface of the base supporting one or more data storage discs for rotation on the spindle motor;
   an actuator assembly positioned on the top surface of the base plate adjacent the data storage disc; and
   a flex printed circuit board assembly on the top surface of the base plate, the flex printed circuit board assembly including a stiffener attached to a bottom surface of a flexible printed circuit, and having actuator and motor electronic control components thereon, wherein the stiffener is metal and forms a ground plane for the circuitry on the flexible printed circuit.

2. The data storage device of claim 1 further comprising a power plane formed on the stiffener beneath the flexible printed circuit.

3. A flexible printed circuit assembly for use in a data storage device having an actuator assembly adjacent a spindle motor rotating one or more data storage discs, the assembly comprising:
   a flexible printed circuit having a pigtail lead for connection to the actuator assembly of the data storage device and a pigtail lead for connection to the spindle motor of the data storage device;
   actuator control and signal processing electronics components mounted on, and electrically connected to, the flexible printed circuit; and
   a stiffener plate coextensive with a portion of the flexible printed circuit forming a ground plane for the components on the flexible printed circuit.

4. The flexible printed circuit assembly of claim 3 further comprising:
   an interface connector attached to the flexible printed circuit and to the stiffener.

5. The flexible printed circuit assembly of claim 4 further comprising a power plane formed on the stiffener for providing power to the components on the flexible printed circuit.

6. The flexible printed circuit assembly of claim 5 wherein the power plane and ground plane are separated by an insulator.

7. A printed circuit assembly comprising:
   a flexible printed circuit having one or more electronic circuit components requiring a ground and a power connection mounted thereon;
   a stiffener plate coextensive with a portion of the flexible printed circuit forming a ground plane connected to the one or more components.

8. The assembly according to claim 7 further comprising a power plane formed from the stiffener plate connected to said one or more components forming the power connection therebetween.

9. The assembly according to claim 8 wherein said one or more components includes a multi-chip package.

10. The assembly according to claim 8 wherein said power plane and ground plane lie in a common plane of the stiffener plate.

11. The assembly according to claim 7 further comprising one or more discrete circuit components fastened to the flexible printed circuit and to one of the ground and power planes.

* * * * *